United States Patent
Moloudi et al.

(10) Patent No.: US 12,199,510 B2
(45) Date of Patent: Jan. 14, 2025

(54) RADIO FREQUENCY (RF) POWER AMPLIFIER WITH TRANSFORMER FOR IMPROVED OUTPUT POWER, WIDEBAND, AND SPURIOUS REJECTION

(71) Applicant: QUALCOMM Incorporated, San Diego, CA (US)

(72) Inventors: Shervin Moloudi, Los Angeles, CA (US); Mohammadali Panahi, Los Angeles, CA (US)

(73) Assignee: QUALCOMM Incorporated, San Diego, CA (US)

( * ) Notice: Subject to any disclaimer, the term of this patent is extended or adjusted under 35 U.S.C. 154(b) by 176 days.

(21) Appl. No.: 17/586,344

(22) Filed: Jan. 27, 2022

(65) Prior Publication Data

US 2023/0238881 A1   Jul. 27, 2023

(51) Int. Cl.
| | | |
|---|---|---|
| H03F 3/24 | (2006.01) | |
| H02M 1/34 | (2007.01) | |
| H02M 3/158 | (2006.01) | |
| H03F 3/193 | (2006.01) | |
| H03F 3/21 | (2006.01) | |

(52) U.S. Cl.
CPC .......... *H02M 3/158* (2013.01); *H02M 1/342* (2021.05)

(58) Field of Classification Search
CPC .......... H03F 3/193; H03F 3/211; H03F 3/245; H03F 2200/451; H03F 2200/541; H03F 2203/45731
See application file for complete search history.

(56) References Cited

U.S. PATENT DOCUMENTS

| | | | | |
|---|---|---|---|---|
| 4,673,888 A | * | 6/1987 | Engelmann | H02M 7/5387 363/43 |
| 4,716,353 A | * | 12/1987 | Engelmann | H02M 3/285 320/139 |
| 4,779,035 A | * | 10/1988 | Engelmann | H02J 7/007182 320/139 |
| 4,994,760 A | * | 2/1991 | Roehrs | H03F 1/0277 330/276 |
| 9,882,601 B1 | * | 1/2018 | Feldman | H04B 1/44 |
| 2003/0102915 A1 | * | 6/2003 | Wight | H03F 3/211 330/251 |
| 2004/0027199 A1 | * | 2/2004 | Wight | H03F 3/2178 330/251 |
| 2004/0075492 A1 | * | 4/2004 | Wight | H03F 3/211 330/165 |
| 2005/0007194 A1 | * | 1/2005 | Grundlingh | H03F 3/211 330/251 |
| 2005/0195031 A1 | * | 9/2005 | Grundlingh | H03F 1/565 330/251 |

(Continued)

*Primary Examiner* — Sisay G Tiku
(74) *Attorney, Agent, or Firm* — Loza & Loza (57) ABSTRACT

An aspect of the disclosure relates to a radio frequency (RF) power amplifier, including a set of transistors, and a transformer including a set of primary windings and a secondary winding, wherein the set of primary windings are coupled in series with the set of transistors between a first voltage rail and a second voltage rail, wherein the set of transistors includes respective control terminals configured to receive an input RF signal, and wherein an output RF signal is produced across a load coupled in parallel with the secondary winding. In another implementation, the primary windings are primary winding portions or turns.

19 Claims, 6 Drawing Sheets

(56) References Cited

U.S. PATENT DOCUMENTS

| | | | |
|---|---|---|---|
| 2007/0024369 A1* | 2/2007 | Cao | H10K 85/791 330/269 |
| 2011/0051842 A1* | 3/2011 | van der Heijden | H03F 1/0294 375/295 |
| 2011/0273234 A1* | 11/2011 | van der Heijden | H03F 1/0294 330/295 |
| 2014/0035673 A1* | 2/2014 | Ortiz | H03F 3/45076 330/261 |
| 2014/0132352 A1* | 5/2014 | Hansen | H03F 1/565 330/295 |
| 2014/0347124 A1* | 11/2014 | Joshi | H03F 3/24 330/51 |
| 2014/0347133 A1* | 11/2014 | Qureshi | H03F 1/07 330/295 |
| 2015/0288334 A1* | 10/2015 | Cai | H03F 3/21 330/252 |
| 2015/0372645 A1* | 12/2015 | Banerjee | H03F 1/0294 330/251 |
| 2015/0381057 A1* | 12/2015 | Luu | H02M 7/5387 363/21.01 |
| 2016/0268974 A1* | 9/2016 | Banerjee | H03F 3/211 |
| 2017/0257067 A1* | 9/2017 | Abe | H03F 1/14 |
| 2018/0006609 A1* | 1/2018 | Banerjee | H03F 1/0294 |
| 2018/0006618 A1* | 1/2018 | Mohta | H04B 1/0475 |
| 2019/0238106 A1* | 8/2019 | Mohta | H04B 1/525 |
| 2019/0334489 A1* | 10/2019 | Hamidian | H01L 23/66 |
| 2021/0105047 A1* | 4/2021 | Mishra | H04B 1/006 |
| 2022/0103134 A1* | 3/2022 | Fard | H01F 38/14 |
| 2022/0224295 A1* | 7/2022 | Dinc | H03F 3/245 |
| 2022/0321067 A1* | 10/2022 | Sutardja | H03F 1/347 |
| 2023/0098175 A1* | 3/2023 | Weberg | H04B 1/1607 455/552.1 |
| 2023/0126116 A1* | 4/2023 | Husain | H03F 1/565 330/250 |

* cited by examiner

RADIO FREQUENCY (RF) POWER AMPLIFIER WITH TRANSFORMER FOR IMPROVED OUTPUT POWER, WIDEBAND, AND SPURIOUS REJECTION

FIELD

Aspects of the present disclosure relate generally to radio frequency (RF) power amplifiers, and in particular, to an RF power amplifier with a transformer configured to increase output power, achieve wider bandwidths, and improve spurious rejection.

BACKGROUND

A radio frequency (RF) power amplifier is typically employed in a transmitter or transceiver to boost the power of an input RF signal to generate an output RF signal with sufficient power for wireless transmission to one or more remote devices. In some cases, the RF power amplifier is implemented in an integrated circuit (IC) or a system on chip (SOC) that is manufactured using technology nodes suitable for digital baseband signal processing. Devices or transistors implemented using technology nodes suitable for digital baseband signal processing are typically small (e.g., 28 nanometers (nm), 22 nm, 14 nm, etc.). Generally, using such small devices in RF power amplifiers to deliver the signal power for wireless transmission is challenging.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to a power amplifier. The power amplifier includes a set of transistors including a first transistor and a second transistor; and a transformer including a set of primary windings and a secondary winding, the set of primary windings including a first primary winding and a second primary winding, the first primary winding coupled in series with the first transistor between a first voltage rail and a second voltage rail, the second primary winding coupled in series with the second transistor between the first voltage rail and the second voltage rail, the set of transistors including respective control terminals configured to receive an input radio frequency (RF) signal, and wherein an output RF signal is produced across a load coupled to the secondary winding.

Another aspect of the disclosure relates to a power amplifier. The radio frequency (RF) power amplifier includes a set of transistors; and a transformer including a set of primary winding portions and a secondary winding, wherein each primary winding portion of the set of primary winding portions is coupled in series with a respective transistor of the set of transistors between a first voltage rail and a second voltage rail, wherein the set of transistors includes respective control terminals configured to receive an input radio frequency (RF) signal, and wherein an output RF signal is produced across a load coupled in parallel with the secondary winding.

Another aspect of the disclosure relates to a wireless communication device. The wireless communication device includes one or more signal processing cores; a transceiver coupled to the one or more signal processing cores, wherein the transceiver includes a radio frequency (RF) power amplifier, including: a set of transistors; and a transformer including a set of primary windings and a secondary winding, wherein the set of primary windings are coupled in series with the set of transistors between a first voltage rail and a second voltage rail, the set of transistors include respective control terminals configured to receive an input RF signal, and wherein an output RF signal is produced across the secondary winding; and at least one antenna coupled to the transceiver.

Another aspect of the disclosure relates to a wireless communication device. The wireless communication device includes one or more signal processing cores; a transceiver coupled to the one or more signal processing cores, wherein the transceiver includes a radio frequency (RF) power amplifier, including: a set of transistors; and a transformer including a set of primary winding portions and a secondary winding, wherein the set of primary winding portions are coupled in series with the set of transistors between a first voltage rail and a second voltage rail, the set of transistors include respective control terminals configured to receive an input RF signal, and wherein an output RF signal is produced across the secondary winding; and at least one antenna coupled to the transceiver.

Another aspect of the disclosure relates to a method. The method includes applying an input radio frequency (RF) signal to a first control input of a first transistor and a second control input of a second transistor, wherein the first transistor is coupled in series with a first primary winding of a transformer between a first voltage rail and a second voltage rail, and the second transistor is coupled in series with a second primary winding of the transformer between the first voltage rail and the second voltage rail; generating an output RF signal across a secondary winding of the transformer based on the input RF signal; and providing the output RF signal to a load.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Wireless communications using the Institute of Electrical and Electronic Engineers (IEEE) 802.11 protocols (colloquially referred to as WiFi) has dramatically increased over the years, and is still increasing at a fast rate. Due to more WiFi devices being used, there is a need to increase the power levels of radio frequency (RF) signals transmitted by such WiFi devices. Further, as there is also a need for WiFi devices to process signals much faster and in a more power efficient manner, the size or technology nodes of devices have progressively become smaller (e.g., 28 nanometer (nm), 22 nm, and 14 nm transistors). An additional need may be related to product costs, where there may be a preference for using integrated circuits (ICs) or system on chips (SOCs) that include both digital baseband signal processing circuitry, as well as RF signal processing circuitry including power amplifiers for amplifying RF signals for wireless transmission. Although applicability to WiFi is used as an example, it shall be understood that the concepts described herein may be applicable to other protocols, such as wide area networks (WANs) including $4^{th}$ Generation Long Term Evolution (LTE), $5^{th}$ Generation New Radio (NR), as well as others.

Figure 1A:
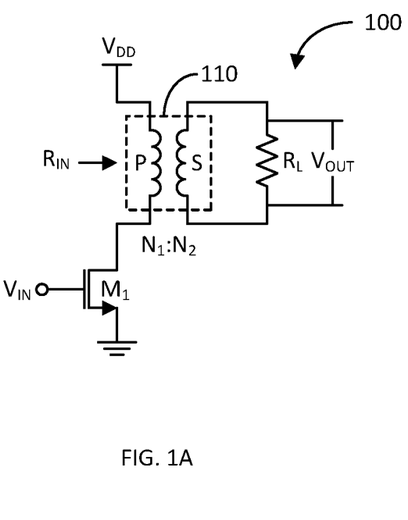
FIG. 1A illustrates a schematic of an example radio frequency (RF) power amplifier in accordance with an aspect of the disclosure.

FIG. 1A illustrates a schematic of an example radio frequency (RF) power amplifier 100 in accordance with an aspect of the disclosure. The RF power amplifier 100 includes a field effect transistor (FET) $M_1$, which may be configured as an n-channel metal oxide semiconductor (NMOS) FET. It shall be understood that the transistor $M_1$ and all other transistors described herein may be implemented as a FET, NMOS FET, p-channel metal oxide semiconductor (PMOS) FET, bipolar junction transistor (BJT), or other type. A control terminal, as used herein, refers to the gate of a FET or the base of a BJT. A terminal may refer to either the drain or source of a FET, or the collector or emitter of a BJT.

The RF power amplifier 100 further includes a transformer 110 including a primary winding (P) and a secondary winding (S). The primary winding (P) is coupled in series with the NMOS FET $M_1$ between an upper voltage rail $V_{DD}$ and a lower voltage rail (e.g., ground). An input radio frequency (RF) signal $V_{IN}$ may be applied to the gate of the NMOS FET $M_1$.

The secondary winding (S) of the transformer 110 is coupled in parallel with a load, represented as a load resistor $R_L$. In many applications, such as a wireless transmitter or transceiver, the load resistor $R_L$ may represent at least one antenna and/or other circuitry interfacing the RF power amplifier 100 to the at least one antenna. As an example, for impedance matching purposes, it may be customary to set the impedance of the load resistor $R_L$ to 50 Ohms ($\Omega$), 75$\Omega$, or other. In the transformer 110, the secondary winding (S) is electromagnetically coupled to the primary winding (P). Further, in this example, the primary winding (P) has $N_1$ turns, and the secondary winding (S) has $N_2$ turns; so that the transformer 110 has a turn ratio of $N_1/N_2$ or often represented as $N_1:N_2$. The RF power amplifier 100 is configured to generate an output RF signal $V_{OUT}$ across the secondary winding (S) and/or the load $R_L$ based on a gain of the input RF signal $V_{IN}$.

Figure 1B:
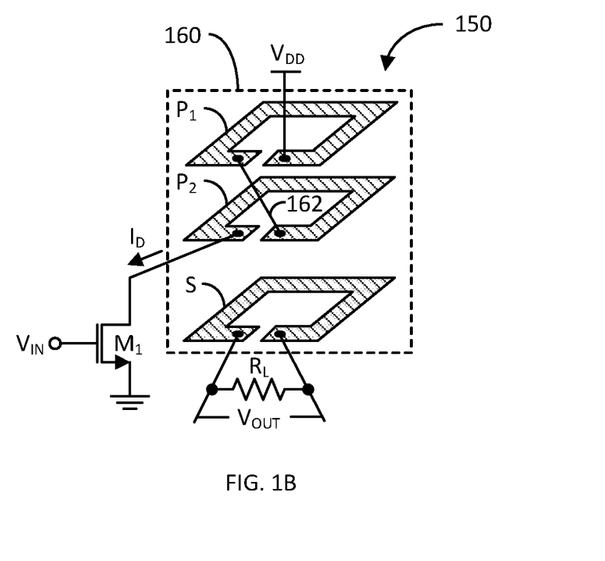
FIG. 1B illustrates a semi-physical implementation of an example radio frequency (RF) power amplifier in accordance with another aspect of the disclosure.

FIG. 1B illustrates a semi-physical implementation of an example radio frequency (RF) power amplifier 150 in accordance with another aspect of the disclosure. The RF power amplifier 150 may be an example physical implementation of the RF power amplifier 100 previously discussed.

In particular, the RF power amplifier 150 includes an NMOS FET $M_1$ including a gate configured to receive an input RF signal $V_{IN}$. The RF power amplifier 150 further includes a transformer 160 including an upper primary winding ($P_1$) and a lower primary winding ($P_2$). As an example, the upper primary winding ($P_1$) may be implemented on a first metallization layer in an IC, and the lower primary winding ($P_2$) may be implemented on a second metallization layer in the IC, where the first metallization layer is above the second metallization layer. A metallized via hole 162 may electrically couple the upper primary winding ($P_1$) to the lower primary winding ($P_2$). The primary windings ($P_1$) and ($P_2$) are coupled in series with the NMOS FET $M_1$ between an upper voltage rail $V_{DD}$ and a lower voltage rail (e.g., ground).

The secondary winding (S) of the transformer 160 is coupled in parallel with a load, represented as a load resistor $R_L$ (e.g., at least one antenna and/or associated circuitry). The primary windings ($P_1$) and ($P_2$) and secondary winding (S) are electromagnetically coupled to each other. The secondary winding (S) may be on a different metallization layer as the metallization layers on which the primary windings ($P_1$) and ($P_2$) are formed. Further, in this example, the primary windings ($P_1$) and ($P_2$) have collectively two (2) turns, and the secondary winding (S) has one (1) turn; so that the transformer 160 has a turn ratio of two (2). Similarly, the RF power amplifier 150 is configured to generate an output RF signal $V_{OUT}$ across the secondary winding (S) and/or the load $R_L$ based on a gain of the input RF voltage $V_{IN}$.

Figure 1C:
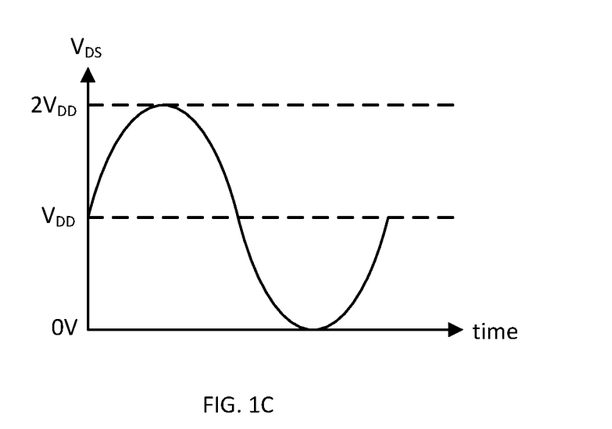
FIG. 1C illustrates a graph of an example drain-to-source voltage $V_{DS}$ of a field effect transistor (FET) used in the (RF) power amplifier of FIG. 1A or 1B in accordance with another aspect of the disclosure.

FIG. 1C illustrates a graph of an example drain-to-source voltage $V_{DS}$ of the NMOS FET $M_1$ used in the (RF) power amplifier 100 or 150 over time in accordance with another aspect of the disclosure. The horizontal axis represents time, and the vertical axis represents the drain-to-source voltage $V_{DS}$ of the NMOS FET $M_1$. As the graph illustrates, the drain-to-source voltage $V_{DS}$ of the NMOS FET $M_1$ varies between substantially $2V_{DD}$ and 0 Volt (V).

As discussed above, for cost reduction purposes, it may be preferable to include the digital baseband signal processing circuitry and the RF signal processing circuitry, including the RF power amplifier 100 or 150, on the same IC or SOC. As such, the RF power amplifier 100 or 150 may use the same type of FETs that are used for digital baseband signal processing, which are generally small in size and may not be able to withstand large voltage swings, such as $2V_{DD}$ across the NMOS FET $M_1$ of RF power amplifier 100 or 150.

Mathematically, the maximum power $P_{OUT}$ delivered to the load $R_L$ may be given by the following equation:

$$P_{OUT} = \frac{V_{DD}^2}{2\left(\frac{N_1}{N_2}\right)R_L} \qquad \text{Eq. 1}$$

Where $R_L$ also represents the resistance of the load $R_L$. Rewriting Eq. 1, the following equation is obtained:

$$\frac{N_1}{N_2} = \frac{V_{DD}}{\sqrt{2R_L P_{OUT}}} \qquad \text{Eq. 2}$$

As an example, if $V_{DD}$ is 2.3V and $R_L$ is 50Ω, and an output power $P_{OUT}$ of 27 decibel-milliwatts (dBm) is desired, then the turn ratio $N_1/N_2$ of the transformer 110 or 160 should be 1/3 according to Eq. 2.

If higher output power $P_{OUT}$ is desired, the voltage $V_{DD}$ at the upper voltage rail may be increased according to Eq. 1. However, this has the drawback of subjecting the NMOS FET $M_1$ to higher voltages, which may adversely impact the reliability of the NMOS FET $M_1$ especially if they are implemented using small features for improved processing of digital baseband signals. Further, according to Eq. 1, the output power $P_{OUT}$ is also a function of the load resistance $R_L$. However, the load resistance $R_L$ is typically set to a particular resistance for impedance matching purposes, such as 50Ω or 75Ω. Accordingly, the other variable that may be used to increase the output power $P_{OUT}$ is the turn ratio $N_1/N_2$ of the transformer 110 or 150.

As illustrated in FIG. 1A, the resistance $R_{IN}$ looking into the primary winding (P) of the transformer 110 may be given by the following equation:

$$R_{IN} = R_L\left(\frac{N_1}{N_2}\right)^2 \qquad \text{Eq. 3}$$

Considering the previous example, where $V_{DD}$=2.3V, $R_L$=50Ω, and $P_{OUT}$=27 dBm, the resistance $R_{IN}$ looking into the primary winding (P) is 5.5Ω according to Eq. 3. If, for example, it is desired to double the output power $PO_{UT}$, where $V_{DD}$=2.3V, $R_L$=50Ω, and $P_{OUT}$=30 dBm, the resistance $R_{IN}$ looking into the primary winding (P) is 2.75Ω according to Eq. 3. This technique of increasing the output power $PO_{UT}$ may have a limit when the resistance $R_{IN}$ reaches a level (e.g., around 1Ω) where parasitic resistance (e.g., of the primary winding, metallization traces, pads, wirebonds, vias, connections, etc.) tend to dominate.

Figure 2A:
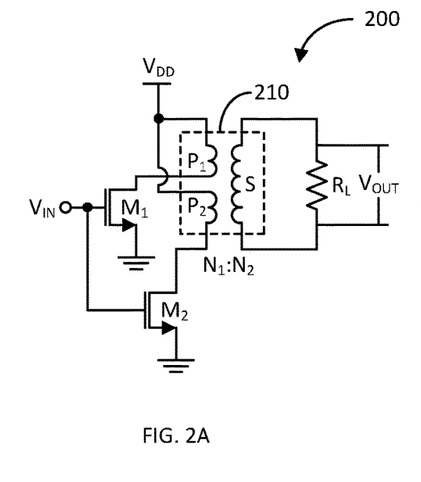
FIG. 2A illustrates a schematic of another example radio frequency (RF) power amplifier in accordance with another aspect of the disclosure.

FIG. 2A illustrates a schematic of another example radio frequency (RF) power amplifier 200 in accordance with another aspect of the disclosure. In some aspect, the primary winding of the transformer of the RF power amplifier 200 is split into two windings each electromagnetically coupled with the secondary winding S. Each primary winding is coupled between an upper voltage rail $V_{DD}$ and an NMOS FET driven by the same input RF signal $V_{IN}$. Each primary winding conducts substantially the same drain current $I_D$ in the same direction, which produces the same electromagnetic coupling of the primary winding (P) to the secondary winding (S) of the RF power amplifier 100. Thus, as the cumulative drain current $I_D$ through the primary windings is $2*I_D$, the electromagnetic coupling to the secondary winding is doubled, and the output power $P_{OUT}$ may be increased (e.g., theoretically may be doubled) without increasing the supply voltage at the upper voltage rail $V_{DD}$, which has the adverse effect of stressing the NMOS FETs.

In particular, the RF power amplifier 200 includes a transformer 210, a first NMOS FET $M_1$, and a second NMOS FET $M_2$. The transformer 210 includes a first primary winding ($P_1$) coupled in series with the first NMOS FET $M_1$ between an upper voltage rail $V_{DD}$ and a lower voltage rail (e.g., ground). The transformer 210 includes a second primary winding ($P_2$) coupled in series with the second NMOS FET $M_2$ between the upper voltage rail $V_{DD}$ and the lower voltage rail (e.g., ground). The gates of the NMOS FETs $M_1$ and $M_2$ are coupled together, and configured to receive an input RF signal $V_{IN}$. In this configuration, the primary windings ($P_1$) and ($P_2$) are coupled to the upper voltage rail $V_{DD}$ such that the currents $I_D$ through the windings are in the same direction in response to the NMOS FETs $M_1$ and $M_2$ being driven by the input RF signal $V_{IN}$.

The transformer 210 further includes a secondary winding (S) coupled in parallel with a load $R_L$ (e.g., at least one antenna and/or associated circuitry). The primary windings ($P_1$) and ($P_2$) and secondary winding (S) are electromagnetically coupled together. The primary windings ($P_1$) and ($P_2$) cumulatively may have $N_1$ number of turns, and the secondary winding may have $N_2$ number of turns. Accordingly, the transformer 210 may have a turn ratio of $N_1/N_2$. The RF power amplifier 200 is configured to generate an output RF signal $V_{OUT}$ across the secondary winding (S) and/or the load $R_L$ based on a power gain of the input RF signal $V_{IN}$.

Compared to the RF power amplifier 100, the RF power amplifier 200 is able to deliver more (e.g., ideally four times) signal power to the load $R_L$ (in practice, may be slightly less than four times the signal power due to parasitic and/or other non-ideal characteristics). The drain-to-voltage $V_{DS}$ of each of the NMOS FETs $M_1$ and $M_2$ of the RF power amplifier 200 swings from 0V to $V_{DD}$; whereas the drain-to-voltage $V_{DS}$ swing of the NMOS FET $M_1$ of the RF power amplifier 100 is subjected to $2*V_{DS}$ voltage swing. Thus, the NMOS FETs $M_1$ and $M_2$ of the RF power amplifier 200 are under less stress than the NMOS FET $M_1$ of the RF power amplifier 100. Additionally, each of the primary windings ($P_1$) and ($P_2$) of the power amplifier 200 conducts current $I_D$, whereas the primary winding (P) of the RF power amplifier 100 conducts current $I_D$. Thus, at the expense of double the current $I_D$, the RF power amplifier 200 is able to deliver substantially four times the amount of power to the load $R_L$.

Figure 2B:
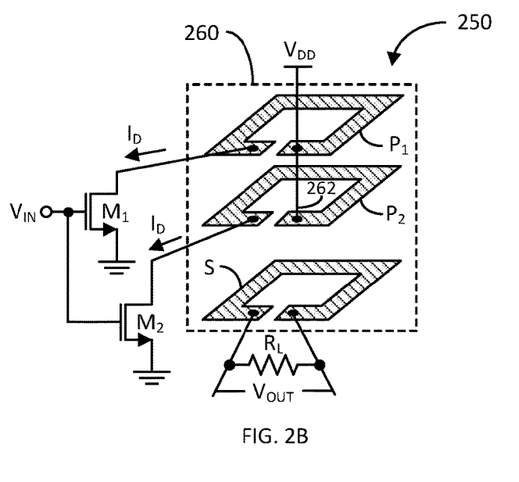
FIG. 2B illustrates a semi-physical implementation of another example radio frequency (RF) power amplifier in accordance with another aspect of the disclosure.

FIG. 2B illustrates a semi-physical implementation of another example radio frequency (RF) power amplifier 250 in accordance with another aspect of the disclosure. The RF power amplifier 250 may be an example physical implementation of the RF power amplifier 200 previously discussed.

In particular, the RF power amplifier 250 includes first and second NMOS FETs $M_1$ and $M_2$ including gates coupled together, and configured to receive an input RF signal $V_{IN}$. The RF power amplifier 250 further includes a transformer 260 including an upper primary winding ($P_1$) and a lower primary winding ($P_2$). As an example, the upper primary winding ($P_1$) may be implemented on a first metallization layer in an IC, and the lower primary winding ($P_2$) may be implemented on a second metallization layer in the IC, where the first metallization layer is above the second metallization layer. A metallized via hole 262 may electrically couple the upper primary winding ($P_1$) to the lower primary winding ($P_2$). The primary winding ($P_1$) is coupled in series with the first NMOS FET $M_1$ between an upper voltage rail $V_{DD}$ and a lower voltage rail (e.g., ground). Similarly, the primary winding ($P_2$) is coupled in series with the second NMOS FET $M_2$ between the upper voltage rail $V_{DD}$ and the lower voltage rail (e.g., ground). In this configuration, the primary windings ($P_1$) and ($P_2$) are coupled to the upper voltage rail $V_{DD}$ such that the currents $I_D$ through the windings are in the same direction in response to the NMOS FETs $M_1$ and $M_2$ being driven by the input RF signal $V_{IN}$.

The secondary winding (S) of the transformer 260 is coupled in parallel with a load, represented as a load resistor $R_L$ (e.g., at least one antenna and/or associated circuitry). The primary windings ($P_1$) and ($P_2$) and secondary winding (S) are electromagnetically coupled to each other. The secondary winding (S) may be formed on a different metallization layer as the metallization layers on which the primary windings ($P_1$) and ($P_2$) are formed. Further, in this example, the primary windings ($P_1$) and ($P_2$) have two (2) turns, and the secondary winding (S) has one (1) turn; so that the transformer 260 has a turn ratio of two (2). Similarly, the RF power amplifier 250 is configured to generate output RF signal $V_{OUT}$ across the secondary winding (S) and the load $R_L$ based on a power gain of the input RF signal $V_{IN}$. Although the implementations described herein include one or more primary windings or portion thereof, and one secondary winding, it shall be understood that other implementations may have different numbers of primary windings or turns, primary winding portions or turns, and secondary windings or turns.

Figure 3A:
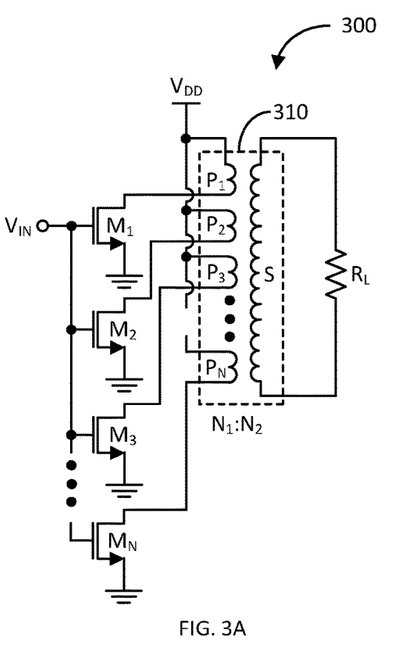
FIG. 3A illustrates a schematic of another example radio frequency (RF) power amplifier in accordance with another aspect of the disclosure.

FIG. 3A illustrates a schematic of another example radio frequency (RF) power amplifier 300 in accordance with another aspect of the disclosure. The RF power amplifier 300 may be a general extension of the RF power amplifier 200 previously discussed. That is, the RF power amplifier 300 has a transformer that includes a set of N primary windings coupled to a set of N NMOS FETs, where N is two (2) or more.

In particular, the RF power amplifier 300 includes a transformer 310, and a set of NMOS FETs $M_1$ to $M_N$. The transformer 310 includes a set of primary windings ($P_1$) to ($P_N$) coupled in series with the set of NMOS FETs $M_1$ to $M_N$ between an upper voltage rail $V_{DD}$ and a lower voltage rail (e.g., ground), respectively. The gates of the set of NMOS FETs $M_1$ to $M_N$ are coupled together, and configured to receive an input RF signal $V_{IN}$. In this configuration, the set of primary windings ($P_1$) to ($P_N$) are coupled to the upper voltage rail $V_{DD}$ such that the currents $I_D$ through the windings are in the same direction in response to the set of NMOS FETs $M_1$ to $M_N$ being driven by the input RF signal $V_{IN}$.

The transformer 310 further includes a secondary winding (S) coupled in parallel with a load $R_L$ (e.g., at least one antenna and/or associated circuitry). The set of primary windings ($P_1$) to ($P_N$) and secondary winding (S) are electromagnetically coupled together. The set of primary windings ($P_1$) to ($P_N$) cumulatively may have $N_1$ number of turns, and the secondary winding may have $N_2$ number of turns. Accordingly, the transformer 310 may have a turn ratio of $N_1/N_2$. The RF power amplifier 300 is configured to generate an output RF signal $V_{OUT}$ across the secondary winding (S) and the load $R_L$ based on a power gain of the input RF signal $V_{IN}$. Compared to the RF power amplifier 100, the RF power amplifier 200 ideally is able to deliver $N^2$ times the signal power to the load $R_L$ (in practice, may be slightly less than $N^2$ times the signal power due to parasitic and/or other non-ideal characteristics).

Figure 3B:
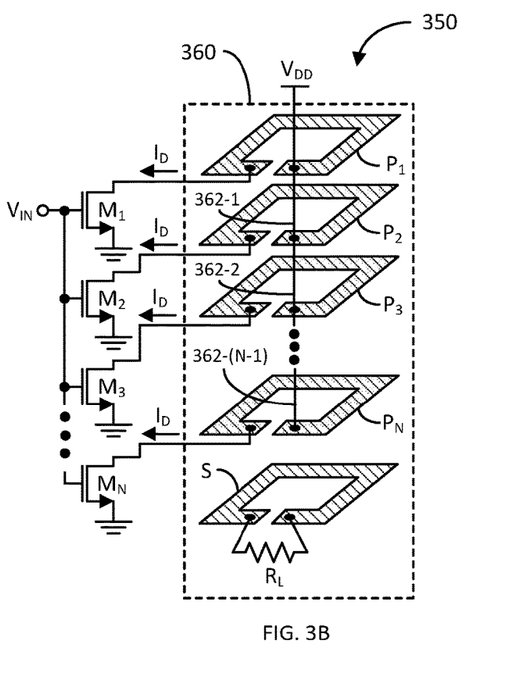
FIG. 3B illustrates a semi-physical implementation of another example radio frequency (RF) power amplifier in accordance with another aspect of the disclosure.

FIG. 3B illustrates a semi-physical implementation of another example radio frequency (RF) power amplifier 350 in accordance with another aspect of the disclosure. The RF power amplifier 350 may be an example physical implementation of the RF power amplifier 300 previously discussed.

In particular, the RF power amplifier 350 includes a set of NMOS FETs $M_1$ to $M_N$ including gates coupled together, and configured to receive an input RF signal $V_{IN}$. The RF power amplifier 350 further includes a transformer 360 including a set of primary windings ($P_1$) to ($P_N$). As an example, the set of primary winding ($P_1$) to ($P_N$) may be implemented on a set of different (e.g., descending) metallization layers in an IC. A set of metallized via holes 362-1 to 362-(N−1) may electrically couple the set of primary winding ($P_1$) to ($P_N$) together, respectively. The set of primary windings ($P_1$) to ($P_N$) is coupled in series with the set of NMOS FETs $M_1$ to $M_N$ between an upper voltage rail $V_{DD}$ and a lower voltage rail (e.g., ground), respectively. In this configuration, the set of primary windings ($P_1$) to ($P_N$) are coupled to the upper voltage rail $V_{DD}$ such that the currents $I_D$ through the windings are in the same direction in response to the set of NMOS FETs $M_1$ to $M_N$ being driven by the input RF signal $V_{IN}$.

The secondary winding (S) of the transformer 360 is coupled in parallel with a load, represented as a load resistor $R_L$ (e.g., at least one antenna and/or associated circuitry). The set of primary windings ($P_1$) to ($P_N$) and secondary winding (S) are electromagnetically coupled to each other. The secondary winding (S) may be on a different metallization layer as the metallization layers on which the set of primary windings ($P_1$) to ($P_N$) are formed. Further, in this example, the set of primary windings ($P_1$) to ($P_N$) may have N turns, and the secondary winding (S) may have one (1) turn; so that the transformer 360 may have a turn ratio of N.

Similarly, the RF power amplifier 350 is configured to generate output RF signal $V_{OUT}$ across the secondary winding (S) and the load $R_L$ based on a power gain of the input RF signal $V_{IN}$.

Figure 4A:
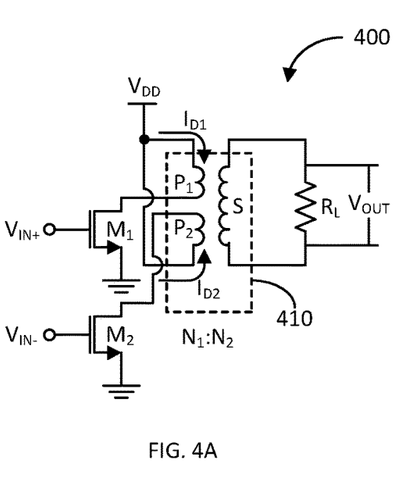
FIG. 4A illustrates a schematic of another example radio frequency (RF) power amplifier in accordance with another aspect of the disclosure.

FIG. 4A illustrates a schematic of another example radio frequency (RF) power amplifier 400 in accordance with another aspect of the disclosure. The RF power amplifier 400 is a differential signal implementation based on the RF power amplifier 200 previously discussed.

In particular, the RF power amplifier 400 includes a transformer 410, a first NMOS FET $M_1$, and a second NMOS FET $M_2$. The transformer 410 includes a first primary winding ($P_1$) coupled in series with the first NMOS FET $M_1$ between an upper voltage rail $V_{DD}$ and a lower voltage rail (e.g., ground). The transformer 410 includes a second primary winding ($P_2$) coupled in series with the second NMOS FET $M_2$ between the upper voltage rail $V_{DD}$ and the lower voltage rail (e.g., ground). The gate of the NMOS FETs $M_1$ is configured to receive a positive component $V_{IN+}$ of an input differential RF signal, and the gate of the NMOS FETs $M_2$ is configured to receive a negative component $V_{IN-}$ of the input differential RF signal. The connections of the primary windings ($P_1$) and ($P_2$) to the upper voltage rail $V_{DD}$ are such that, while the drain bias currents of NMOS FETs $M_1$ and $M_2$ flow downwards from the upper voltage rail $V_{DD}$, the alternating current (ac) components of $I_{D1}$ and $I_{D2}$ flow in opposite directions; i.e., when $I_{D1}$ increases in response to a rising $V_{IN+}$ and a falling $V_{IN-}$, $I_{D2}$ decreases, effectively causing a counterclockwise circulating ac current across the primary windings ($P_1$) and ($P_2$). In a similar manner, a clockwise ac current will be created when $V_{IN-}$ is rising and $V_{IN+}$ is falling.

The transformer 410 further includes a secondary winding (S) coupled in parallel with a load $R_L$ (e.g., at least one antenna and/or associated circuitry). The primary windings ($P_1$) and ($P_2$) and secondary winding (S) are electromagnetically coupled together. The primary windings ($P_1$) and ($P_2$) cumulatively may have $N_1$ number of turns, and the secondary winding may have $N_2$ number of turns. Accordingly, the transformer 410 may have a turn ratio of $N_1/N_2$. The RF power amplifier 400 is configured to generate an output RF signal $V_{OUT}$ across the secondary winding (S) and the load $R_L$ based on a power gain of the input differential RF signal $V_{IN+}/V_{IN-}$.

In operation, during the positive peak phase of the positive component $V_{IN+}$ of the input differential RF signal (coinciding with the negative peak phase of the negative component $V_{IN-}$), the current $I_{D1}$ is greater than the current $I_{D2}$. Thus, the net ac current through the primary windings ($P_1$) and ($P_2$) is positive (counterclockwise); and thus, the output voltage $V_{OUT}$ is positive. During the positive peak phase of the negative component $V_{IN-}$ of the input differential RF signal (coinciding with the negative peak phase of the positive component $V_{IN+}$), the current $I_{D2}$ is greater than the current $I_{D1}$. Thus, the net ac current through the primary windings ($P_1$) and ($P_2$) is negative (clockwise); and thus, the output voltage $V_{OUT}$ is negative. This differential signal operation applies to the other differential signal power amplifiers described herein.

Figure 4B:
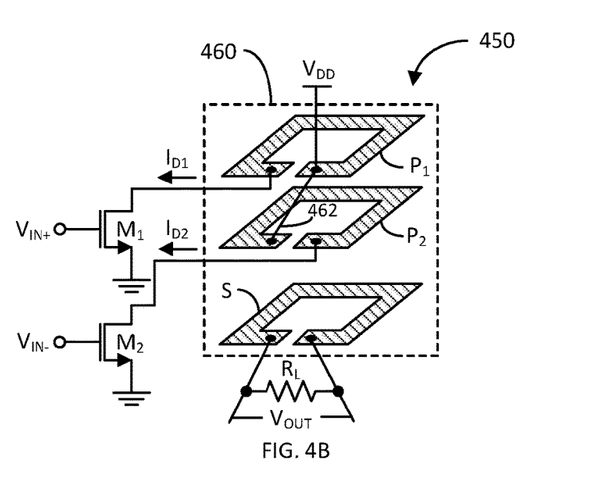
FIG. 4B illustrates a semi-physical implementation of another example radio frequency (RF) power amplifier in accordance with another aspect of the disclosure.

FIG. 4B illustrates a semi-physical implementation of another example radio frequency (RF) power amplifier 450 in accordance with another aspect of the disclosure. The RF power amplifier 450 may be an example physical implementation of the RF power amplifier 400 previously discussed.

In particular, the RF power amplifier 450 includes NMOS FETs $M_1$ and $M_2$ including gates configured to receive a positive component $V_{IN+}$ and a negative component $V_{IN-}$ of an input RF signal, respectively. The RF power amplifier 450 further includes a transformer 460 including primary windings ($P_1$) and ($P_2$). As an example, the primary winding ($P_1$) may be implemented on a first metallization layer and the primary winding ($P_2$) may be implemented on a second metallization layer in the IC, where the first metallization layer is above the second metallization layer. A metallized via hole 462 may electrically couple the upper primary winding ($P_1$) to the lower primary winding ($P_2$). The primary windings ($P_1$) and ($P_2$) are coupled in series with NMOS FETs $M_1$ and $M_2$ between an upper voltage rail $V_{DD}$ and a lower voltage rail (e.g., ground), respectively. The connections of the primary windings ($P_1$) and ($P_2$) to the upper voltage rail $V_{DD}$ are such that, while the drain bias current of NMOS FETs $M_1$ and $M_2$ flow downwards from the upper voltage rail $V_{DD}$, the ac components of currents $I_{D1}$ and $I_{D2}$ flow in opposite directions; i.e., when $I_{D1}$ increases in response to a rising $V_{IN+}$ and a falling $V_{IN-}$, $I_{D2}$ decreases, effectively causing a counterclockwise circulating current across the primary windings ($P_1$) and ($P_2$). In a similar manner, a clockwise ac current will be created when $V_{IN-}$ is rising and $V_{IN+}$ is falling.

The secondary winding (S) of the transformer 460 is coupled in parallel with a load, represented as a load resistor $R_L$ (e.g., at least one antenna and/or associated circuitry). The primary windings ($P_1$) and ($P_2$) and secondary winding (S) are electromagnetically coupled to each other. The secondary winding (S) may be on a different metallization layer as the metallization layers on which primary windings ($P_1$) and ($P_2$) are formed. Further, in this example, the primary windings ($P_1$) and ($P_2$) may have two (2) turns, and the secondary winding (S) may have one (1) turn; so that the transformer 460 may have a turn ratio of two (2). Similarly, the RF power amplifier 450 is configured to generate output RF signal $V_{OUT}$ across the secondary winding (S) and the load $R_L$ based on a power gain of the input differential RF signal $V_{IN+}/V_{IN-}$.

Figure 5:
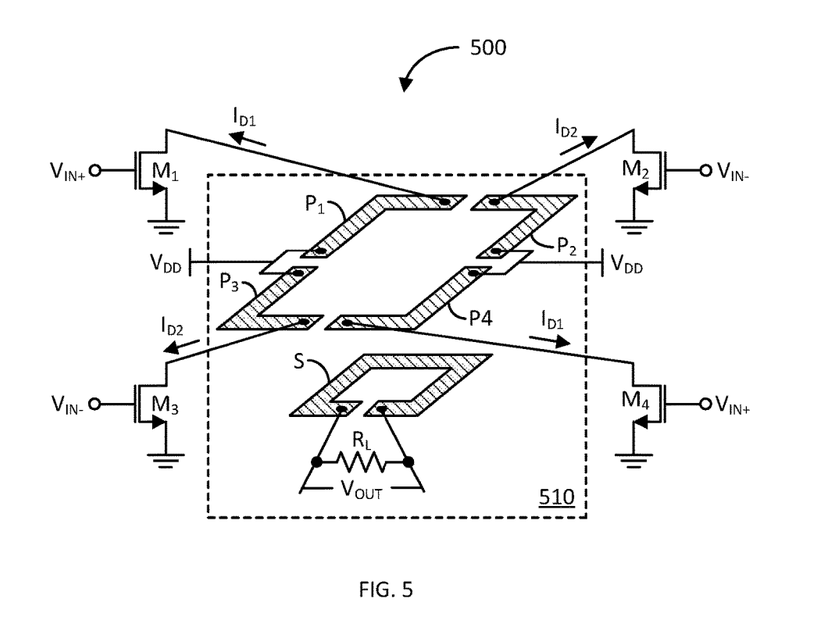
FIG. 5 illustrates a semi-physical implementation of another example radio frequency (RF) power amplifier in accordance with another aspect of the disclosure.

FIG. 5 illustrates a semi-physical implementation of another example radio frequency (RF) power amplifier 500 in accordance with another aspect of the disclosure. In this example, a primary winding may be divided into separate primary winding portions or turns. This may be the case where there is not enough IC area to implement separate primary windings on different metallization layers.

In particular, the RF power amplifier 500 includes a transformer 510, and a set of NMOS FETs $M_1$ to $M_4$. The transformer 510 includes a first primary winding portion or turn ($P_1$), a second primary winding portion or turn ($P_2$), a third primary winding portion or turn ($P_3$), and a fourth primary winding portion or turn ($P_4$). In this example, the cumulative primary winding portions ($P_1$) to ($P_4$) may extend substantially a single primary winding. The primary winding portions ($P_1$) to ($P_4$) may be implemented on the same metallization layer or different metallization layers in different combinations (e.g., ($P_1$) and ($P_4$) on the same layer, ($P_2$) and ($P_3$) on a different layer, ($P_1$)-($P_4$) on different metallization layers, respectively, etc.).

The primary winding portions ($P_1$) to ($P_4$) are coupled in series with the NMOS FETs $M_1$ to $M_4$ between an upper voltage rail $V_{DD}$ and a lower voltage rail (e.g., ground), respectively. The gates of the NMOS FETs $M_1$ and $M_4$ are configured to receive a positive component $V_{IN+}$ of an input differential RF signal, and the gates of the NMOS FETs $M_2$ and $M_3$ are configured to receive a negative component $V_{IN-}$ of the input differential RF signal. The connections of the primary winding portions ($P_1$) to ($P_4$) to the upper voltage rail $V_{DD}$ are such that the ac components of currents $I_{D1}$ flow in the same direction (e.g., clockwise if $V_{IN+}>V_{IN-}$, and counterclockwise if $V_{IN+}<V_{IN-}$) along the primary winding portions ($P_1$) and ($P_4$) in response to the NMOS FETs $M_1$ and $M_4$ being driven by the positive component $V_{IN+}$. The mirrored connection of primary windings ($P_2$) and ($P_3$) guarantees that the ac components of currents $I_{D2}$ also flow in the same direction through primary windings ($P_2$) and ($P_3$) in response to the NMOS FETs $M_2$ and $M_3$ being driven by the negative component $V_{IN-}$. This will effectively cause the ac current to circulate in the same direction across all primary winding segments ($P_1$) to ($P_4$).

The transformer 510 further includes a secondary winding (S) coupled in parallel with a load $R_L$ (e.g., at least one antenna and/or associated circuitry). The primary winding portions ($P_1$) to ($P_4$) and secondary winding (S) are electromagnetically coupled together. The secondary winding (S) may be implemented on the same or different metallization layer as any one or more of the primary winding portions ($P_1$) to ($P_4$). As an example, the secondary winding (S) may be collectively surrounded by the primary winding portions ($P_1$) to ($P_4$) on the same metallization layer. Alternatively, the secondary winding (S) may surround the primary windings ($P_1$) to ($P_4$) on the same metallization layer. As mentioned, the primary winding portions ($P_1$) to ($P_4$) cumulatively may have a single turn, and the secondary winding (S) may also have a single turn. Accordingly, the transformer 510 may have a turn ratio of $N_1/N_2$ equal to one (1). The RF power amplifier 500 is configured to generate an output RF signal $V_{OUT}$ across the secondary winding (S) and the load $R_L$ based on a power gain of the input differential RF signal $V_{IN+}/V_{IN-}$.

Figure 6A:
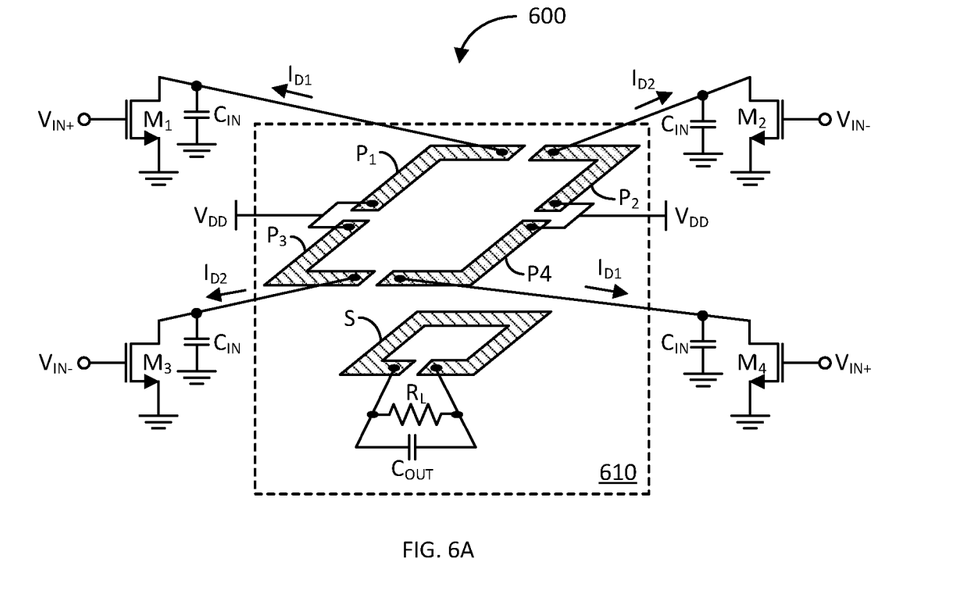
FIG. 6A illustrates a semi-physical implementation of another example radio frequency (RF) power amplifier in accordance with another aspect of the disclosure.

FIG. 6A illustrates a semi-physical implementation of another example radio frequency (RF) power amplifier 600 in accordance with another aspect of the disclosure. The RF power amplifier 600 is similar to that of RF power amplifier 500 previously discussed, but includes capacitors to achieve a wider frequency bandwidth.

In particular, the RF power amplifier 600 includes a transformer 610, a set of NMOS FETs $M_1$ to $M_4$, a set of input capacitors $C_{IN}$, and an output capacitor $C_{OUT}$. The transformer 610 includes a first primary winding portion or turn ($P_1$), a second primary winding portion or turn ($P_2$), a third primary winding portion or turn ($P_3$), and a fourth primary winding portion or turn ($P_4$). In this example, the cumulative primary winding portions ($P_1$) to ($P_4$) may extend substantially a single primary winding. The primary winding portions ($P_1$) to ($P_4$) may be implemented on the same metallization layer.

The primary winding portions ($P_1$) to ($P_4$) are coupled in series with the NMOS FETs $M_1$ to $M_4$ between an upper voltage rail $V_{DD}$ and a lower voltage rail (e.g., ground), respectively. The gates of the NMOS FETs $M_1$ and $M_4$ are configured to receive a positive component $V_{IN+}$ of an input differential RF signal, and the gates of the NMOS FETs $M_2$ and $M_3$ are configured to receive a negative component $V_{IN-}$ of the input differential RF signal. The connections of the primary winding portions ($P_1$) to ($P_4$) to the upper voltage rail $V_{DD}$ are such that the ac components of currents $I_{D1}$ flow in the same direction (e.g., clockwise if $V_{IN+}>V_{IN-}$, and counterclockwise if $V_{IN+}<V_{IN-}$) along the primary winding portions ($P_1$) and ($P_4$) in response to the NMOS FETs $M_1$ and $M_4$ being driven by the positive component $V_{IN+}$. The mirrored connection of primary winding portions ($P_2$) and ($P_3$) guarantees that the ac components of currents $I_{D2}$ flow in the same counterclockwise direction through the primary winding portions ($P_2$) and ($P_3$) in response to the NMOS FETs $M_2$ and $M_3$ being driven by the negative component $V_{IN-}$. This will effectively cause the ac current to circulate in the same direction across all primary winding segments ($P_1$) to ($P_4$).

The transformer 610 further includes a secondary winding (S) coupled in parallel with a load $R_L$ (e.g., at least one antenna and/or associated circuitry). The primary winding portions ($P_1$) to ($P_4$) and secondary winding (S) are electromagnetically coupled together. The secondary winding (S) may be implemented on the same or different metallization layer as the primary winding portions ($P_1$) to ($P_4$). As an example, the secondary winding (S) may be collectively surrounded by the primary winding portions ($P_1$) to ($P_4$) on the same metallization layer. As mentioned, the primary winding portions ($P_1$) to ($P_4$) cumulatively may have a single turn, and the secondary winding (S) may also have a single turn. Accordingly, the transformer 610 may have a turn ratio of $N_1/N_2$ equal to one (1). The RF power amplifier 600 is configured to generate an output RF signal $V_{OUT}$ across the secondary winding (S) and the load $R_L$ based on a power gain of the input differential RF signal $V_{IN+}/V_{IN-}$.

As mentioned above, the RF power amplifier 600 includes the set of input capacitors $C_{IN}$ and the output capacitor $C_{OUT}$. The set of input capacitors $C_{IN}$ are coupled between the drains of the NMOS FETs $M_1$ to $M_4$ and the lower voltage rail (e.g., ground), respectively. The set of input capacitors $C_{IN}$ may be implemented to have substantially the same capacitance. The output capacitor $C_{OUT}$ is coupled in parallel with the load $R_L$. The output capacitor $C_{OUT}$ may be implemented to have a different capacitance as the input capacitors $C_{IN}$ to form frequency-staggered resonances to widen the bandwidth of the RF power amplifier 600 as discussed further herein.

Figure 6B:
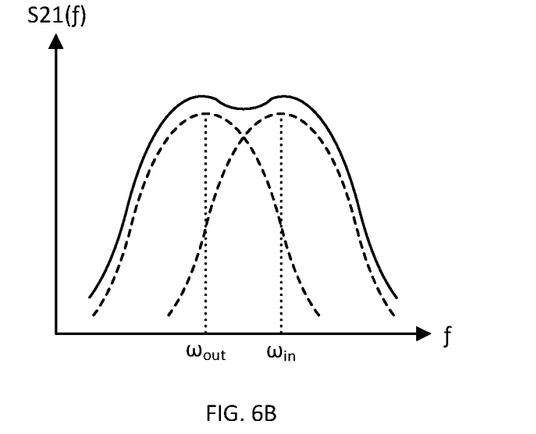
FIG. 6B illustrates a graph of an example gain-frequency response of the RF power amplifier of FIG. 6A in accordance with another aspect of the disclosure.

FIG. 6B illustrates a graph of an example gain-frequency response of the RF power amplifier 600 in accordance with another aspect of the disclosure. The horizontal axis of the graph represents frequency ($f$) and the vertical axis of the graph represents gain or the S21 ($f$) parameter in decibels (dBs).

The graph shows a first resonance frequency response (depicted as a dash line) having a center frequency of $\omega_{in}$, which is attributed to the input capacitors $C_{IN}$ forming resonance with the primary winding portions ($P_1$) to ($P_4$) of the transformer 610, respectively. The graph also shows a second resonance frequency response (also depicted as a dash line) having a center frequency of $\omega_{out}$, which is attributed to the output capacitors $C_{OUT}$ forming resonance with the secondary winding S of the transformer 610. The capacitances of the input capacitors $C_{IN}$ and output capacitor $C_{OUT}$ may be selected to form staggered resonant frequencies $\omega_{in}$ and $\omega_{out}$. For instance, in this example, the output resonant frequency $\omega_{out}$ is slightly lower than the input resonant frequency $\omega_{in}$, which has the effect of producing a gain-frequency response for the RF power amplifier 600 (depicted as a solid line) that has a 3 dB bandwidth above and below the resonant frequencies win and wont. Thus, the input and output capacitors $C_{IN}$ and $C_{OUT}$ may be configured to widen the bandwidth of the RF power amplifier 600.

Figure 7A:
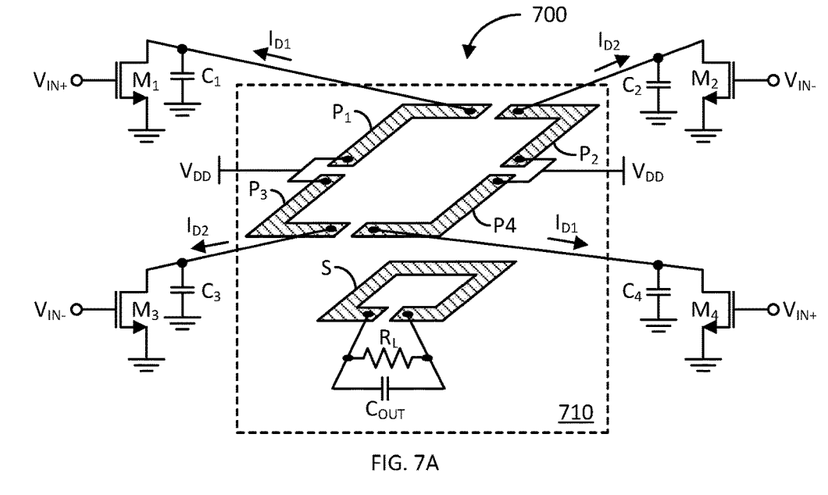
FIG. 7A illustrates a semi-physical implementation of another example radio frequency (RF) power amplifier in accordance with another aspect of the disclosure.

FIG. 7A illustrates a semi-physical implementation of another example radio frequency (RF) power amplifier 700 in accordance with another aspect of the disclosure. The RF power amplifier 700 may be a variation of RF power amplifier 600 previously discussed, but the input capacitors may be implemented with different capacitances to achieve a set of frequency-staggered resonances for wider frequency bandwidth with the option of including at least one notch to suppress spurs at a particular frequency.

In particular, the RF power amplifier 700 includes a transformer 710, a set of NMOS FETs $M_1$ to $M_4$, a set of input capacitors $C_1$ to $C_4$, and an output capacitor $C_{OUT}$ The transformer 710 includes a first primary winding portion or turn ($P_1$), a second primary winding portion or turn ($P_2$), a third primary winding portion or turn ($P_3$), and a fourth primary winding portion or turn ($P_4$). In this example, the cumulative primary winding portions ($P_1$) to ($P_4$) may extend substantially a single primary winding. The primary winding portions ($P_1$) to ($P_4$) may be implemented on the same metallization layer.

The primary winding portions ($P_1$) to ($P_4$) are coupled in series with the NMOS FETs $M_1$ to $M_4$ between an upper voltage rail $V_{DD}$ and a lower voltage rail (e.g., ground), respectively. The gates of the NMOS FETs $M_1$ and $M_4$ are configured to receive a positive component $V_{IN+}$ of an input differential RF signal, and the gates of the NMOS FETs $M_2$ and $M_3$ are configured to receive a negative component $V_{IN-}$ of the input differential RF signal. The connections of the primary winding portions ($P_1$) to ($P_4$) to the upper voltage rail $V_{DD}$ are such that the ac components of currents $I_{D1}$ flow in the same direction (e.g., clockwise if $V_{IN+}>V_{IN-}$, and counterclockwise if $V_{IN+}<V_{IN-}$) along the primary winding portions ($P_1$) and ($P_4$) in response to the NMOS FETs $M_1$ and $M_4$ being driven by the positive component $V_{IN+}$. The mirrored connection of primary winding portions ($P_2$) and ($P_3$) guarantees that the ac components of the currents $I_{D2}$ also flow in the same counterclockwise direction through primary winding portions ($P_2$) and ($P_3$) in response to the NMOS FETs $M_1$ and $M_4$ being driven by the negative component $V_{IN-}$. This will effectively cause the ac current to circulate in the same direction across all primary winding segments ($P_1$) to ($P_4$).

The transformer 710 further includes a secondary winding (S) coupled in parallel with a load $R_L$ (e.g., at least one antenna and/or associated circuitry). The primary winding portions ($P_1$) to ($P_4$) and secondary winding (S) are electromagnetically coupled together. The secondary winding (S) may be implemented on the same or different metallization layer as the primary winding portions ($P_1$) to ($P_4$). As an example, the secondary winding (S) may be collectively surrounded by the primary winding portions ($P_1$) to ($P_4$) on the same metallization layer. As mentioned, the primary winding portions ($P_1$) to ($P_4$) cumulatively may have a single turn, and the secondary winding (S) may also have a single turn. Accordingly, the transformer 710 may have a turn ratio of $N_1/N_2$ equal to one (1). The RF power amplifier 700 is configured to generate an output RF signal $V_{OUT}$ across the secondary winding (S) and the load $R_L$ based on a power gain of the input differential RF signal $V_{IN+}/V_{IN-}$.

As mentioned above, the RF power amplifier 700 includes the set of input capacitors $C_1$ to $C_4$, and the output capacitor $C_{OUT}$ The set of input capacitors $C_1$ to $C_4$ are coupled between the drains of the NMOS FETs $M_1$ to $M_4$ and the lower voltage rail (e.g., ground), respectively. The set of input capacitors $C_1$ to $C_4$ may be implemented with different capacitances to produce a set of frequency-staggered resonances as discussed further herein. The output capacitor $C_{OUT}$ is coupled in parallel with the load $R_L$. The output capacitor $C_{OUT}$ may be implemented to have a different capacitance than any one of the input capacitors $C_1$ to $C_4$ to form an additional different resonance for bandwidth widening purposes.

Figure 7B:
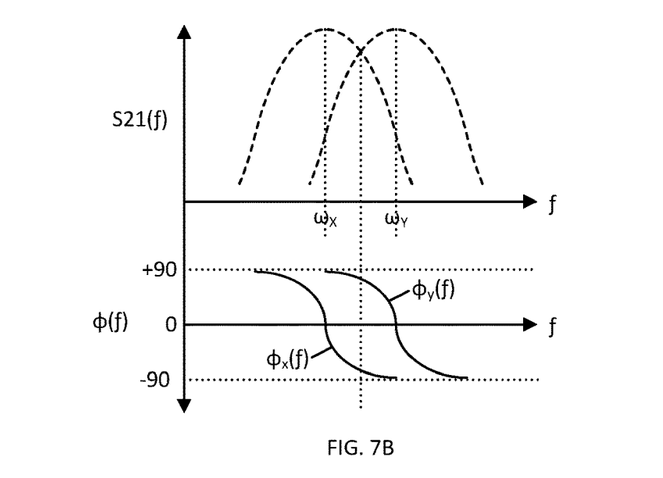
FIG. 7B illustrates a graph of an example gain-phase-frequency response associated with the RF power amplifier of FIG. 7A in accordance with another aspect of the disclosure.

FIG. 7B illustrates a graph of an example gain-phase-frequency response associated with two of the signal paths of the RF power amplifier 700 from the primary to the secondary of a transformer in accordance with another aspect of the disclosure. The horizontal axis of the graph represents frequency ($f$). With regard to the vertical axis, the top portion of the graph represents gain or the $S21(f)$ parameter, and the bottom portion represents phase $\phi(f)$.

The top portion of the graph illustrates two resonances created at closely spaced frequencies $\omega_x$ and $\omega_y$, where the gain responses overlap in frequency. The two close resonances $\omega_x$ and $\omega_y$ may be created by choosing of the capacitances of the input capacitors $C_1$ and $C_4$ to be substantially the same ($C_1=C_4$) to tune the signal paths associated with NMOS FETs $M_1$ and $M_4$ to resonance frequency $\omega_x$ and the capacitances of the other input capacitors $C_2$ and $C_3$ to be substantially the same ($C_2=C_3$) to tune the signal path associated with NMOS FETs $M_2$ and $M_3$ to resonance frequency $\omega_y$.

A property of two close resonances $\omega_x$ and $\omega_y$ is that at the intersection of their gain responses, the phases $\phi_x(f)$ and $\phi_y(f)$ of the two resonances $\omega_x$ and $\omega_y$ are opposite. For example, the phase $\phi_x(f)$ associated with resonance $\omega_x$ extends from +90 degrees at the lower end of the resonance to −90 degrees at the upper end of the resonance, crossing at 0 degree at the center frequency $\omega_x$ of the resonance. Similarly, the phase $\phi_y(f)$ associated with resonance $\omega_y$ extends from +90 degrees at the lower end of the resonance to −90 degrees at the upper end of the resonance, crossing at 0 degree at the center frequency $\omega_y$ of the resonance. Via the capacitances previously discussed, the resonances may be spaced apart in frequency such that at a particular frequency (e.g., $(\omega_x+\omega_y)/2$), a transmission zero from the primary to the secondary of the transformer may be created, because at this point the magnitudes of the responses are the same but the phases are opposite, and this creates a frequency notch to reduce or substantially eliminate unwanted spurs via phase cancellation.

Figure 7C:
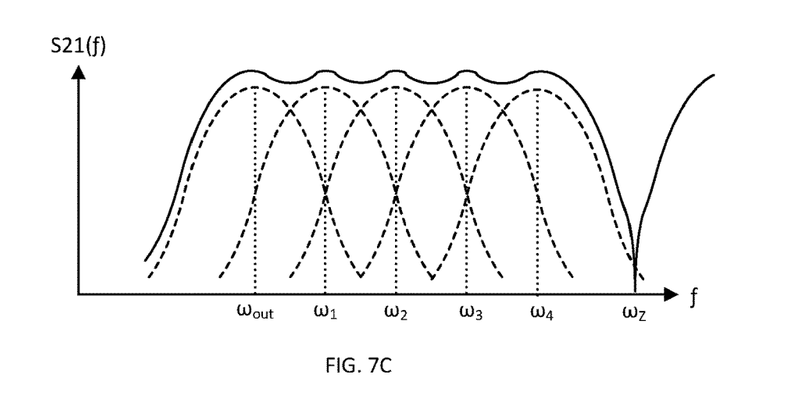
FIG. 7C illustrates a graph of an example gain-frequency response of the RF power amplifier of FIG. 7A in accordance with another aspect of the disclosure.

FIG. 7C illustrates a graph of an example gain-frequency response of the RF power amplifier 700 in accordance with another aspect of the disclosure. The horizontal axis of the graph represents frequency ($f$) and the vertical axis of the graph represents gain or the $S21(f)$ parameter in dBs.

The graph shows a set of frequency-staggered resonances (depicted as dash lines) having a set of center frequencies (from low-to-high) of $\omega_{1-4}$, which are attributed to the input capacitors $C_{1-4}$ forming resonances with the primary winding portions ($P_1$) to ($P_4$) of the transformer 710, respectively. The graph also shows another resonance (also depicted as a dash line) having a center frequency of $\omega_{out}$, which is attributed to the output capacitor $C_{OUT}$ forming a resonance with the secondary winding S of the transformer 710. The capacitances of the input capacitors $C_{1-4}$ and output capacitor $C_{OUT}$ may be selected to form frequency-staggered resonances $\omega_{out}$ and $\omega_{1-4}$. For instance, in this example, the resonances are frequency spaced apart to produce a gain-frequency $S21(f)$ response for the RF power amplifier 700 (depicted as a solid line) that has a 3 dB bandwidth above and below the resonant frequencies $\omega_4$ and $\omega_{out}$, respectively. Additionally, due to the phase property discussed above with respect to FIG. 7B, a notch may be formed at a frequency $w_z$ to reject any unwanted spurs which may exist in that frequency region. More flexibility can be obtained in setting the location of the frequency notch by setting the N capacitors at the transformer primary ($C_1$, $C_2$, $C_3$, and $C_4$ in FIG. 7A) to different values, which creates N different resonance paths, which follow the same phase cancellation principal as mentioned above.

Figure 8:
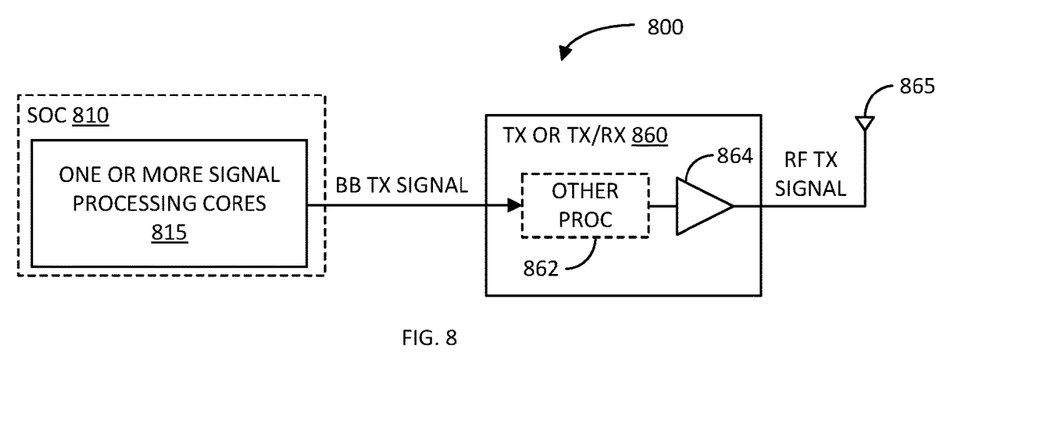
FIG. 8 illustrates a block diagram of an example wireless communication device in accordance with another aspect of the disclosure.

FIG. 8 illustrates a block diagram of an example wireless communication device 800 in accordance with another aspect of the disclosure. The wireless communication device

800 includes an integrated circuit (IC), which may be implemented as a system on chip (SOC) 810. The SOC 810 may include one or more signal processing cores 815 configured to process digital baseband (BB) signals, such as a baseband transmit (BB TX) signal for transmission to one or more remote devices.

The wireless communication device 800 further includes a transmitter or transceiver 860. The transmitter or transceiver 860 is coupled to the one or more signal processing cores 815 of the SOC 810 to receive the baseband transmit (BB TX) signal. The transmitter or transceiver 860 includes other processing circuit 862 configured to convert the baseband transmit (BB TX) signal into an input RF transmit signal. For example, the other processing circuit 862 may include one or more of the following: baseband filter, mixer, local oscillator (LO), RF filter, pre-amplifier, phase shifter, and other components. The transmitter or transceiver 860 further includes an RF power amplifier 864 configured to boost the power of the input RF transmit signal to generate an output RF signal. The RF power amplifier 864 may be configured per any of the RF power amplifiers previously discussed. The wireless communication device 800 further includes at least one antenna 865 coupled to the transmitter or transceiver 860 to receive the output RF signal for wireless transmission.

Figure 9:
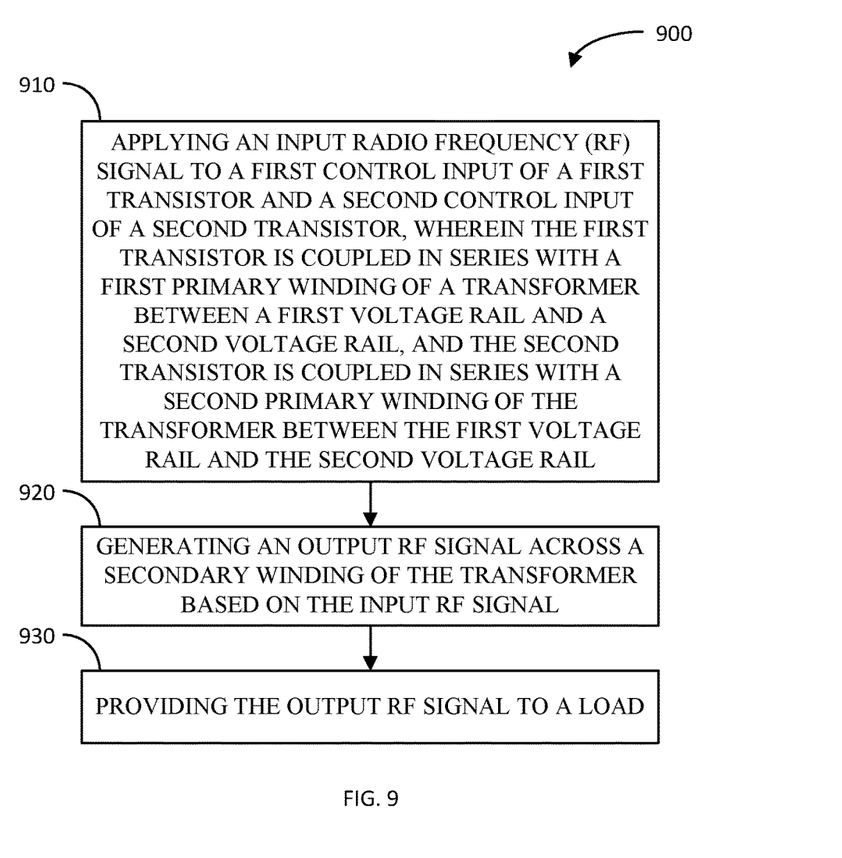
FIG. 9 illustrates a flow diagram of an example method of amplifying an input RF signal to generate an output RF signal in accordance with another aspect of the disclosure.

FIG. 9 illustrates a flow diagram of an example method 900 of amplifying an input RF signal to generate an output RF signal in accordance with another aspect of the disclosure. The method 900 includes applying an input radio frequency (RF) signal to a first control input of a first transistor and a second control input of a second transistor, wherein the first transistor is coupled in series with a first primary winding of a transformer between a first voltage rail and a second voltage rail, and the second transistor is coupled in series with a second primary winding of the transformer between the first voltage rail and the second voltage rail (block 910).

The method 900 further includes generating an output RF signal across a secondary winding of the transformer based on the input RF signal (block 920). Additionally, the method 900 includes providing the output RF signal to a load (block 930). The input signal may comprise a differential input signal including a positive signal component and a negative signal component, wherein applying the input RF signal to the first and second control inputs per block 910 includes applying the positive signal component to the first control input; and applying the negative signal component to the second control input.

The following provides an overview of aspects of the present disclosure:

Aspect 1: A power amplifier including a set of transistors including a first transistor and a second transistor; and a transformer including a set of primary windings and a secondary winding, the set of primary windings including a first primary winding and a second primary winding, the first primary winding coupled in series with the first transistor between a first voltage rail and a second voltage rail, the second primary winding coupled in series with the second transistor between the first voltage rail and the second voltage rail, the set of transistors including respective control terminals configured to receive an input radio frequency (RF) signal, and wherein an output RF signal is produced across a load coupled to the secondary winding.

Aspect 2: The power amplifier of aspect 1, wherein the input RF signal is a differential signal including a positive component and a negative component, wherein one or more control terminals of the set of transistors are configured to receive the positive component of the differential signal, and wherein one or more other control terminals of the set of transistors are configured to receive the negative component of the differential signal.

Aspect 3: The power amplifier of aspect 1 or 2, wherein a first subset of one or more of the set of primary windings are coupled to the first voltage rail such that an ac current in a first direction along the first subset of one or more of the set of primary windings is generated in response to a first subset of one or more of the set of transistors being driven by a positive component of the input RF signal; and wherein a second subset of one or more of the set of primary windings are coupled to the first voltage rail such that an ac current in the first direction along the second subset of one or more of the set of primary windings is generated in response to a second subset of one or more of the set of transistors being driven by a negative component of the input RF signal.

Aspect 4: The power amplifier of any one of aspects 1-3, further including: a set of input capacitors coupled between terminals of the set of transistors and the second voltage rail, respectively; and an output capacitor coupled in parallel with the secondary winding of the transformer.

Aspect 5: The power amplifier of aspect 4, wherein the set of input capacitors have substantially the same capacitance.

Aspect 6: The power amplifier of aspect 4, wherein the set of input capacitors have different capacitances.

Aspect 7: The power amplifier of aspect 4, wherein a capacitance of the output capacitor is different than any one capacitance of the set of input capacitors.

Aspect 8: The power amplifier of aspect 4, wherein capacitances of the set of input capacitors and the output capacitors are set to form a set of frequency-staggered resonances in a gain-frequency response of the power amplifier.

Aspect 9: The power amplifier of aspect 4, wherein at least two capacitances of the set of input capacitors are set to form at least one notch in a gain-frequency response of the power amplifier.

Aspect 10: The power amplifier of any one of aspects 1-9, wherein the set of transistors includes a third transistor and a fourth transistor, wherein the set of primary windings includes a third primary winding and a fourth primary winding, the third primary winding coupled in series with the third transistor between the first voltage rail and the second voltage rail, and the fourth primary winding coupled in series with the fourth transistor between the first voltage rail and the second voltage rail.

Aspect 11: The power amplifier of any one of aspects 1-10, wherein the set of primary windings and the secondary winding are formed on different metallization layers.

Aspect 12: The power amplifier of any one of aspects 1-11, wherein the input RF signal is a single-ended signal.

Aspect 13: A power amplifier, including: a set of transistors; and a transformer including a set of primary winding portions and a secondary winding, wherein each primary winding portion of the set of primary winding portions is coupled in series with a respective transistor of the set of transistors between a first voltage rail and a second voltage rail, wherein the set of transistors includes respective control terminals configured to receive an input RF signal, and wherein an output RF signal is produced across a load coupled in parallel with the secondary winding.

Aspect 14: The power amplifier of aspect 13, wherein the set of primary winding portions are formed on the same metallization layer.

Aspect 15: The power amplifier of aspect 14, wherein the secondary winding is formed on the same metallization layer.

Aspect 16: The power amplifier of aspect 15, wherein the secondary winding is collectively surrounded by the set of primary winding portions.

Aspect 17: The power amplifier of any one of aspects 13-16, wherein the input RF signal is a single-ended signal.

Aspect 18: The power amplifier of any one of aspects 13-16, wherein the input RF signal is a differential signal including a positive component and a negative component, wherein one or more control terminals of the set of transistors are configured to receive the positive component of the differential signal, and wherein one or more other control terminals of the set of transistors are configured to receive the negative component of the differential signal.

Aspect 19: The power amplifier of any one of aspects 13-16 and 18, wherein a first subset of one or more of the set of primary winding portions are coupled to the first voltage rail such that an ac current in a first direction along the first subset of one or more of the set of primary winding portions is generated in response to a first subset of one or more of the set of transistors being driven by a positive component of the input RF signal; and wherein a second subset of one or more of the set of primary winding portions are coupled to the first voltage rail such that an ac current in the first direction along the second subset of one or more of the set of primary winding portions is generated despite a second subset of one or more of the set of transistors being driven by a negative component of the input RF signal.

Aspect 20: The power amplifier of any one of aspects 13-19, further including: a set of input capacitors coupled between terminals of the set of transistors and the second voltage rail, respectively; and an output capacitor coupled in parallel with the secondary winding of the transformer.

Aspect 21: The power amplifier of aspect 20, wherein the set of input capacitors have substantially the same capacitance.

Aspect 22: The power amplifier of aspect 20, wherein the set of input capacitors have different capacitances.

Aspect 23: The power amplifier of aspect 20, wherein a capacitance of the output capacitor is different than any one capacitance of the set of input capacitors.

Aspect 24: The power amplifier of aspect 20, wherein capacitances of the set of input capacitors and the output capacitors are set to form a set of frequency-staggered resonances in a gain-frequency response of the RF power amplifier.

Aspect 25: The power amplifier of aspect 20, wherein at least two capacitances of the set of input capacitors and output capacitors are set to form at least one notch in a gain-frequency response of the RF power amplifier.

Aspect 26: A wireless communication device, including: one or more signal processing cores; a transceiver coupled to the one or more signal processing cores, wherein the transceiver includes a radio frequency (RF) power amplifier, including: a set of transistors; and a transformer including a set of primary windings and a secondary winding, wherein the set of primary windings are coupled in series with the set of transistors between a first voltage rail and a second voltage rail, the set of transistors include respective control terminals configured to receive an input RF signal, and wherein an output RF signal is produced across the secondary winding; and at least one antenna coupled to the transceiver.

Aspect 27: The wireless communication device of aspect 26, wherein the input RF signal is a differential signal including a positive component and a negative component, wherein one or more control terminals of the set of transistors are configured to receive the positive component of the differential signal, and wherein one or more other control terminals of the set of transistors are configured to receive the negative component of the differential signal.

Aspect 28: The wireless communication device of aspect 26 or 27, wherein the RF power amplifier further includes: a set of input capacitors coupled between terminals of the set of transistors and the second voltage rail, respectively; and an output capacitor coupled in parallel with the secondary winding of the transformer.

Aspect 29: A method, including: applying an input radio frequency (RF) signal to a first control input of a first transistor and a second control input of a second transistor, wherein the first transistor is coupled in series with a first primary winding of a transformer between a first voltage rail and a second voltage rail, and the second transistor is coupled in series with a second primary winding of the transformer between the first voltage rail and the second voltage rail; generating an output RF signal across a secondary winding of the transformer based on the input RF signal; and providing the output RF signal to a load.

Aspect 30: The method of aspect 29, wherein the input signal comprises a differential input signal including a positive signal component and a negative signal component, and wherein applying the input RF signal to the first and second control inputs comprises: applying the positive signal component to the first control input; and applying the negative signal component to the second control input.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. A power amplifier, comprising: a set of transistors including a first transistor and a second transistor;
   a transformer including a primary winding and a secondary winding, the primary winding including a first primary winding portion and a second primary winding portion, the first primary winding portion coupled in series with the first transistor between a first voltage rail and a second voltage rail, the second primary winding portion coupled in series with the second transistor between the first voltage rail and the second voltage rail, the first and second transistors including respective control terminals directly coupled together and configured to receive a first component of an input differential radio frequency (RF) signal, wherein the first and second transistors are coupled to the first and second primary winding portions to produce a first current through the first and second primary winding portions that flow in a first direction with respect to the secondary winding in response to the first and second transistors being turned on by the first component of the input differential RF signal, and wherein an output RF signal is produced across a load coupled to the secondary winding;

a set of input capacitors coupled between terminals of the set of transistors and the second voltage rail, respectively; and
an output capacitor coupled in parallel with the secondary winding of the transformer.

2. The power amplifier of claim 1, wherein the set of input capacitors have substantially the same capacitance.

3. The power amplifier of claim 1, wherein the set of input capacitors have different capacitances.

4. The power amplifier of claim 1, wherein a capacitance of the output capacitor is different than any one capacitance of the set of input capacitors.

5. The power amplifier of claim 1, wherein capacitances of the set of input capacitors and the output capacitors are set to form a set of frequency-staggered resonances in a gain-frequency response of the power amplifier.

6. The power amplifier of claim 1, wherein at least two capacitances of the set of input capacitors and output capacitors are set to form at least one notch in a gain-frequency response of the power amplifier.

7. The power amplifier of claim 1, wherein the set of transistors includes a third transistor and a fourth transistor, wherein the primary winding includes a third primary winding portion and a fourth primary winding portion, the third primary winding portion coupled in series with the third transistor between the first voltage rail and the second voltage rail, and the fourth primary winding portion coupled in series with the fourth transistor between the first voltage rail and the second voltage rail, the third and fourth transistors including respective control terminals directly coupled together and configured to receive a second component of the input differential RF signal, wherein the third and fourth transistors are coupled to the third and fourth primary winding portions to produce a second current through the third and fourth primary winding portions that flow in a second direction with respect to the secondary winding in response to the third and fourth transistors being turned on by the second component of the input differential RF signal, the second direction being opposite the first direction.

8. The power amplifier of claim 1, wherein the primary winding and the secondary winding are formed on different metallization layers.

9. A power amplifier, comprising:
a set of transistors;
a transformer including a set of primary windings and a secondary winding, wherein each of the set of primary windings is coupled in series with a respective transistor of the set of transistors between a first voltage rail and a second voltage rail, wherein the set of transistors includes respective control terminals directly coupled together and configured to receive an input radio frequency (RF) signal, wherein the set of transistors are coupled to the set of primary windings to produce currents through the set of primary windings that flow in the same direction with respect to the secondary winding in response to the set of transistors being turned on by the input RF signal, and wherein an output RF signal is produced across a load coupled to the secondary winding;
a set of input capacitors coupled between terminals of the set of transistors and the second voltage rail, respectively; and
an output capacitor coupled in parallel with the secondary winding of the transformer.

10. The power amplifier of claim 9, wherein the set of primary windings are formed on the same metallization layer.

11. The power amplifier of claim 10, wherein the secondary winding is formed on the same metallization layer.

12. The power amplifier of claim 11, wherein the set of primary windings surrounds the secondary winding.

13. The power amplifier of claim 9, wherein the set of input capacitors have substantially the same capacitance.

14. The power amplifier of claim 9, wherein the set of input capacitors have different capacitances.

15. The power amplifier of claim 9, wherein a capacitance of the output capacitor is different than any one capacitance of the set of input capacitors.

16. The power amplifier of claim 9, wherein capacitances of the set of input capacitors and the output capacitors are set to form a set of frequency-staggered resonances in a gain-frequency response of the RF power amplifier.

17. The power amplifier of claim 9, wherein at least two capacitances of the set of input capacitors and output capacitors are set to form at least one notch in a gain-frequency response of the RF power amplifier.

18. A power amplifier, comprising:
a first transistor and a second transistor; and
a transformer including first and second primary windings and a secondary winding, the first primary winding is coupled in series with the first transistor between a first voltage rail and a second voltage rail, the second primary winding is coupled in series with the second transistor between the first voltage rail and the second voltage rail, the first and second transistors include respective gates directly coupled together and configured to receive an input radio frequency (RF) signal, and wherein an output RF signal is produced across a load coupled to the secondary winding.

19. A power amplifier, comprising:
a first transistor, a second transistor, a third transistor, and a fourth transistor; and
a transformer including first, second, third, and fourth primary winding portions and a secondary winding, the first, second, third, and fourth primary winding portions are coupled in series with the first, second, third, and fourth transistors between a first voltage rail and a second voltage rail, respectively, the first and second transistors include respective control terminals directly coupled together and configured to receive a positive component of an input differential radio frequency (RF) signal, the third and fourth transistors include respective control terminals directly coupled together and configured to receive a negative component of the input differential radio frequency (RF) signal, wherein an output RF signal is produced across a load coupled to the secondary winding, wherein the first and second transistors are coupled to the first and second primary winding portions to produce first and second currents through the first and second primary winding portions that flow in a first direction with respect to the secondary winding in response to the first and second transistors being turned on by the positive component of the input differential RF signal, and wherein the third and fourth transistors are coupled to the third and fourth primary winding portions to produce third and fourth currents through the third and fourth primary winding portions that flow in a second direction with respect to the secondary winding in response to the third and fourth transistors being turned on by the negative component of the input differential RF signal, the second direction being opposite the first direction.

* * * * *